United States Patent [19]
Karnezos

[11] Patent Number: 5,843,808
[45] Date of Patent: Dec. 1, 1998

[54] STRUCTURE AND METHOD FOR AUTOMATED ASSEMBLY OF A TAB GRID ARRAY PACKAGE

[75] Inventor: Marcos Karnezos, Menlo Park, Calif.

[73] Assignee: ASAT, Limited, Tsuen Wan, Hong Kong

[21] Appl. No.: 585,134

[22] Filed: Jan. 11, 1996

[51] Int. Cl.$^6$ .................................................. H01L 21/44
[52] U.S. Cl. ......................................... 438/121; 438/122
[58] Field of Search .................................. 438/121, 122, 438/123, 124

[56] References Cited

U.S. PATENT DOCUMENTS

| | | | |
|---|---|---|---|
| 5,409,865 | 4/1995 | Karnezos ................................. | 438/122 |
| 5,420,460 | 5/1995 | Massingill ............................... | 257/693 |
| 5,474,957 | 12/1995 | Urushima ................................ | 438/122 |
| 5,482,898 | 1/1996 | Marrs ...................................... | 438/122 |
| 5,556,807 | 9/1996 | Bhattacharyya et al. ................ | 438/123 |

OTHER PUBLICATIONS

"Design of a Low Cost Wire Bond Tape Ball Grid Array (TBGA) Package", R.D. Schueller and A. P. Plepys, Surface Mount International Proceedings, Aug. 30, 1995, pp. 261–269.

"An Overview of TBGA Bond and Assembly Operations", Michael Bernier, '95 Flip Chip, BGA, TAB & AP Symposium, 1995 Semiconductor Technology Center, Inc. no month.

*Primary Examiner*—Kevin Picardat
*Attorney, Agent, or Firm*—Skjerven, Morrill, MacPherson, Franklin & Friel LLP; Edward C. Kwok

[57] ABSTRACT

A TAB Grid Array (TGA) package allows automated assembly using established manufacturing equipment similar to those used in the production of plastic ball grid Array (PBGA) package assembly. The TGA package are formed, using as starting material, a metal strip having the same critical dimensions and tooling holes as those used for a PBGA package. In this invention, the stiffener is designed to serve as a carrier throughout the assembly of the TGA package. The wire bonded TGA cavity package, including the solder balls, is first fully assembled prior to the attachment of the semiconductor die. Subsequently, the semiconductor die is attached to the stiffener, wires are bonded between the semiconductor die and the tape frame, and the entire assembly is encapsulated. The process of the present invention provides a high device assembly yield usually not achievable by the PBGA packages. The choice of high temperature tape and epoxy allows the use of high temperature solder balls which provide for higher package-to-motherboard assembly reliability. Further, the high electrical performance of the TGA package is achieved by using a two-metal layer tape. In one embodiment, the first layer is used for signal connections, the second layer is used for routing the power signal and the stiffener is used for routing the ground signal.

9 Claims, 8 Drawing Sheets

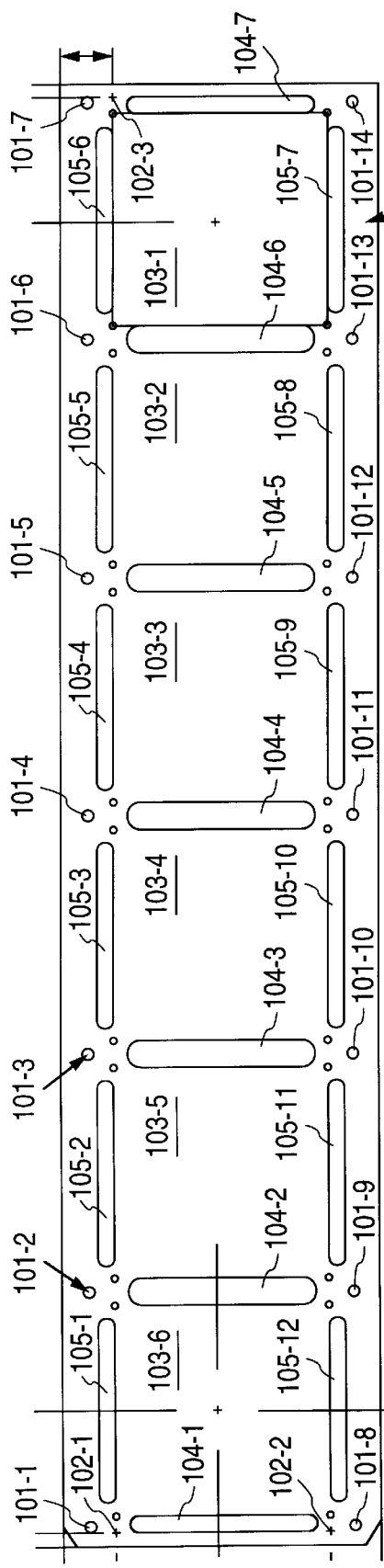
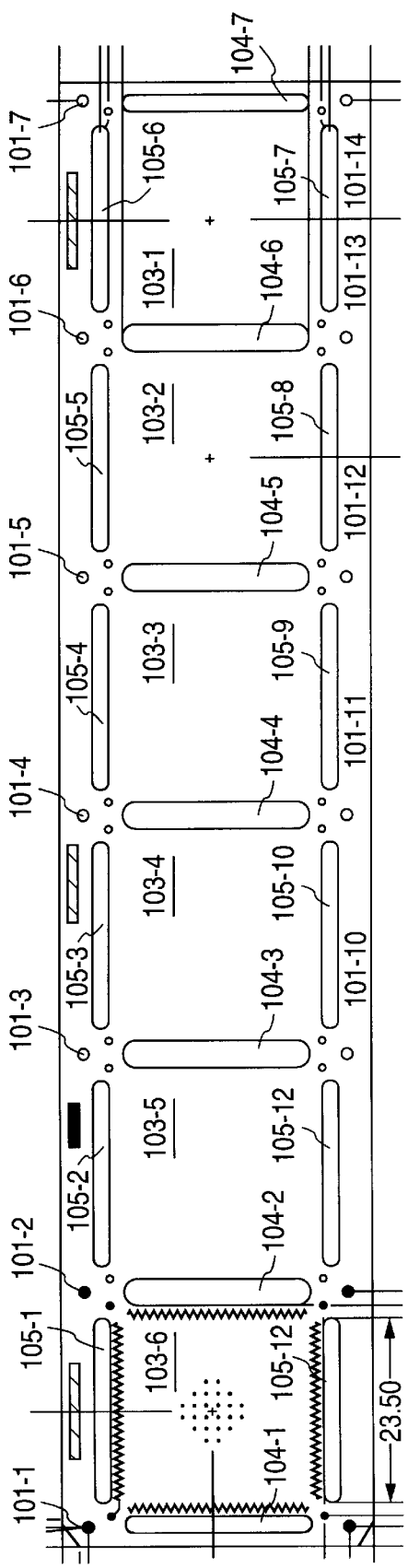
FIGURE 1A (PRIOR ART)
FIGURE 1B (PRIOR ART)
BOTTOM PATTERN

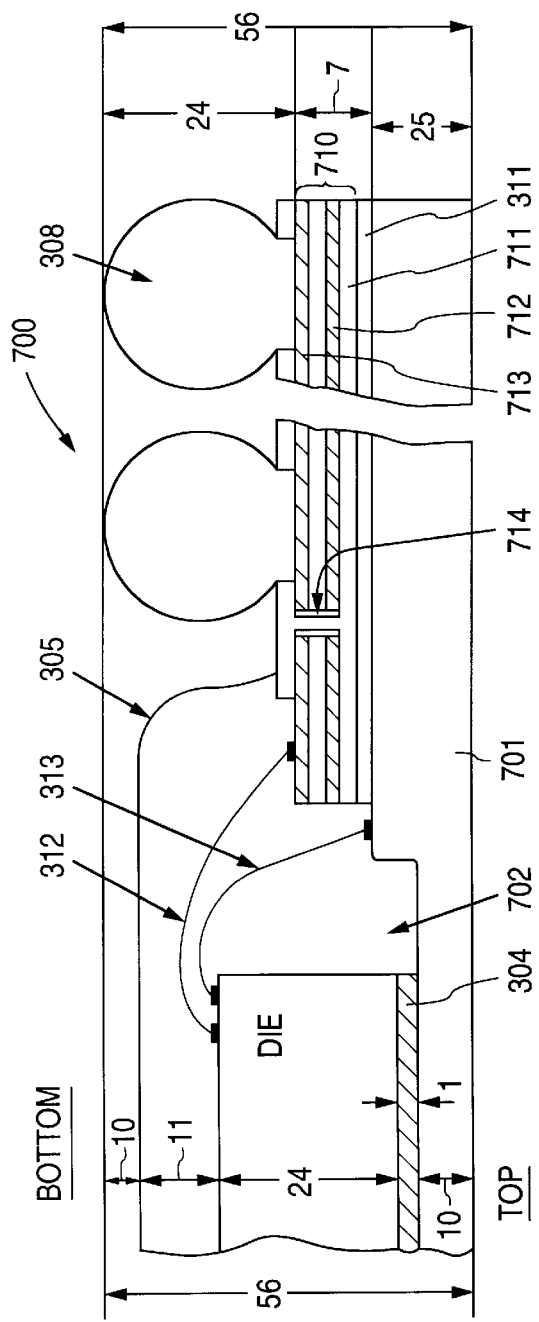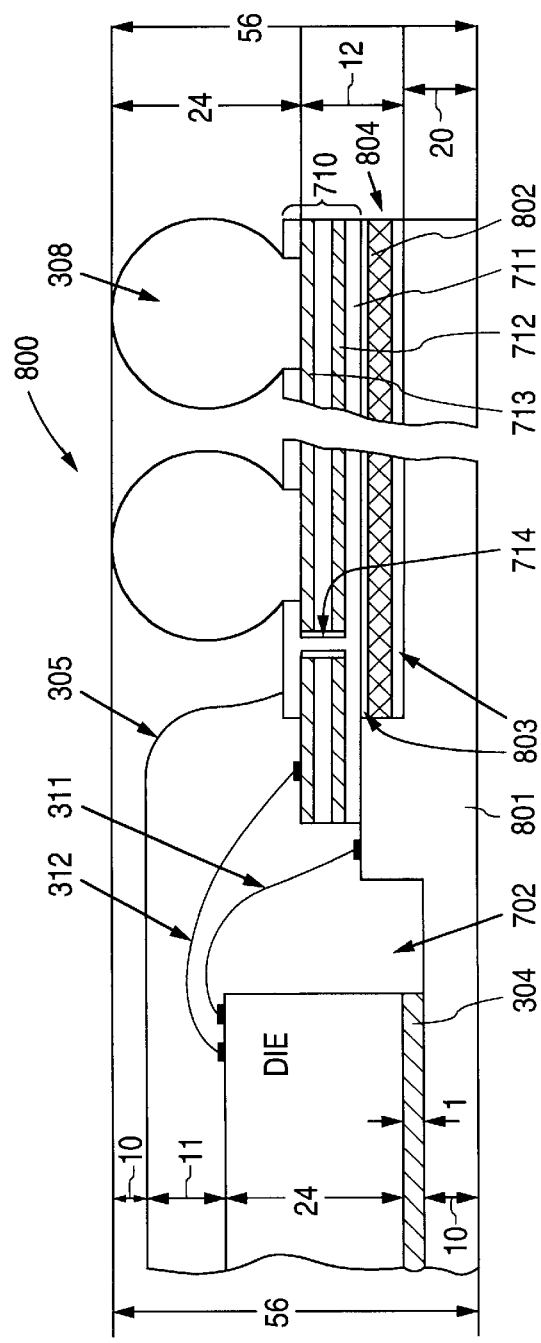

STRUCTURE AND METHOD FOR AUTOMATED ASSEMBLY OF A TAB GRID ARRAY PACKAGE

BACKGROUND OF THE INVENTION

1. Field of the Invention

The present invention relates to the design of packages for integrated circuits (ICs). In particular, the present invention relates to package designs that provide for assembly automation, low material cost and high assembly yield. The present invention also relates to a package design that provides for high reliability and high thermal and electrical performances.

2. Description of the Related Art

The packages described in the present application are known as tape grid arrays (TGAs). An example of such a package is disclosed in U.S. Pat. No. 5,409,865, to Karnezos, filed Feb. 25, 1994 and issued Apr. 25, 1995, which is a divisional application of U.S. Pat. No. 5,397,921, filed Sept. 3, 1993 and issued Mar. 3, 1995.

High performance packages for integrated circuits are complex in construction and are usually produced in low volumes. As a result, the investment necessary to automate the production process is seldom economically unjustifiable. Consequently, such high performance packages are usually assembled one at a time. An example of such a high performance package is the tape ball grid array (TBGA) package assembled by IBM. The IBM TBGA package is similar to the TGA packages described in the U.S. Patents mentioned above, yet the IBM TBGA package requires the use of very different assembly process and equipment from those used in the TGA packages. The assembly process for the IBM TBGA package is disclosed in a paper titled "An Overview of TBGA Bond and Assembly Operations" by M. Bernier, Proceedings of '95 Flip Chip, BGA, TAB & AP Symposium, published in 1995 by Semiconductor Technology Center, Inc. In the process disclosed in Bernier's paper, the TBGA packages suffer from a number of disadvantages: (i) the TBGA packages are assembled one at a time; (ii) the solder balls, which provide external connections to the integrated circuit in each package, are attached to the packages one package at a time; and (iii) special proprietary equipment, which is not amenable to high-speed operation and automated material handling, is required. Consequently, the process disclosed by Bernier for his TBGA package is a low throughput operation with high labor and depreciation costs, as well as low yields and low final product reliability.

Another type of packages, known as plastic ball grid arrays (PBGAs) have an assembly process amenable to automation. Multiple PBGAs can be formed from a single printed circuit board (PCB) strip. In a PGBA process, standard equipment have been designed which provide automation and high throughput. However, both the materials used and the assembly process place significant limitations to further cost reduction, enhanced yield, enhanced reliability and enhanced thermal and electrical performances. These drawbacks of the PBGA package are discussed in further detail below.

As mentioned above, a PBGA package is formed out of a PCB strip, which constitutes a substrate for providing interconnection in the package and which serves as a package carrier, providing structural support, throughout the assembly process. However, in a PBGA package, a certain amount of PCB material, reaching as much as 50% of the PCB trip, is excised and discarded. Since the PCB material constitutes more than 50% of the total cost of a PBGA package, the discarded material can amount to 25% of the final package cost of the PBGA package. Thus, significant cost savings can be achieved, if this material wastage is eliminated or is reduced to a few percentage points.

In the assembly process of a PBGA, the semiconductor die is attached to the PCB strip prior to assembling the remainder of the package. Thus, any yield loss during the assembly process or arising from defective package materials necessarily include the loss of a semiconductor die, thereby significantly increasing the averaged final cost of the assembled product. It is generally recognized that higher yield can be achieved by assembling of the package prior to die assembly.

Also, the PBGAs are constrained to use conventional eutectic solder balls that have a melting point at about 180° C. and which reflow at about 220° C. Eutectic solder balls must be used because the PCB material used in a PBGA package is made of organic materials, including different types of epoxies, such as Bismalimide Triazine (BT) resin MGCCCL-HL832 manufactured by Mitsubishi Gas Chemicals Co. Such BT resin has a low glass transition temperature of 180° C. above which the resin softens. Consequently, if the temperature is raised significantly higher than the reflow temperature of the eutectic solder balls, i.e. 220° C., for any prolonged period of time, damage to the PCB material results. For this reason, higher temperature solder balls, e.g. those which reflow above 300° C., cannot be used with the BT resin based PBGA packages. Eutectic solder balls that are reflowed on the package is a disadvantage from the point of view of a downstream user of such a PGBA package. In the manufacturing of a motherboard, for example, when a PBGA is removed from the motherboard for rework, as is sometimes required, some of the eutectic solder balls will often separate from the PBGA package, adhering to the motherboard from which the package is removed. Consequently, to complete such rework, reassembly requires re-dressing both the motherboard and the PBGA package, thereby incurring an undue high cost to the motherboard manufacturer. This problem can be avoided if only higher temperature solder balls can be used. Such higher temperature solder balls would be reflowed at high temperature onto the PBGA package, which is subsequently assembled onto the motherboard using an eutectic solder material. In such an arrangement, during rework, the solder balls would remain with the package upon removal. As a result, reassembly would be relatively simple and would incur much lower cost.

The reliability of the solder balls in any ball grid array (BGA) package, including a PBGA package, can be compromised by (a) solder ball fatigue, and (b) shear stresses at the interface between a solder ball and the motherboard on which the PBGA package is installed. Solder ball fatigue is a phenomenon commonly brought about by the differential thermal expansion between the package and the motherboard during thermal cycling. Such differential thermal expansion causes bending and flexing of the solder balls to result in fatigue cracks. This effect is illustrated by FIG. 1c, which shows a solder ball 120, attached to solder ball pads 125 of an integrated circuit package 123 and a motherboard 122, cracking under shear stresses on both ends 126. Under the differential thermal expansion between package 123 and mother board 122, the two ends 126 of solder ball 120 move in opposing directions, thereby causing shear stress at both ends 125 that tend to "rock" solder ball 120 away from it's normal position. Because both package 123 and motherboard 122 are solid objects which flex very little, the shear stresses on solder ball 120 are not relieved. As a result, the solder ball joints of the BPGA package tend to fail by cracking and delamination, starting at ends 126. Solder ball fatigue can be avoided by using higher temperature solder balls, rather than eutectic solder balls, because the higher temperature solder balls have their higher elastic moduli which minimize bending and fatigue cracking.

The thermal performance of a PBGA package is also limited because the heat conductivities of both the PCB and the molding compound surrounding the semiconductor die are low, so as to present a large thermal resistance which prevents heat generated by the semiconductor die from being conducted to the ambient. In addition, the electrical performance of a PBGA package is limited by the parasitic impedances of relatively long interconnect traces of the PCB. The PCB used in a PBGA package typically requires both large through hole vias (e.g. 10 mils) and large line widths (e.g. 4 mils). A denser routing technique would require multilayer PCBs, which would further increase the length of the interconnect traces, as well as the manufacturing cost.

SUMMARY OF THE INVENTION

In accordance with the present invention a package design and an assembly process are provided for a TGA package. The TGA package of the present invention includes (i) a stiffener for providing structural support for the TGA package; (ii) a tape frame attached to said stiffener, the tape frame including (a) a conductive layer which provides wire bonding pads, (b) solder ball bonding pads and (c) conductive traces for interconnecting the wire bonding pads and the solder ball bonding pads; (iii) a semiconductor die attached in a cavity of the stiffener; (iv) bond wires interconnecting conductors on the semiconductor die and said the wire bonding pads on the tape frame; (v) solder balls attached to the solder ball bond pads of the tape frame for external electrical connections; and (vi) an encapsulation encapsulating the entire TGA package, except for a portion of each solder ball to allow electrical connections to an external circuit board.

In one embodiment, the stiffener is formed out of a thermally conductive material so that the stiffener can serve as a heat spreader for the TGA package. The stiffener can be attached by a thermoset or thermoplastic adhesive that can withstand a high temperature reflow procedure for high reliability attachment of solder balls.

In one embodiment, the stiffener is plated, at a periphery of the cavity, a wire bondable material, so as to accommodate a ground bonding between the semiconductor die to the stiffener. To allow automated handling and manufacturing of the stiffener, the stiffener is singulated from a strip. Such a strip, which is provided tooling holes and alignment marks to allow automated machine handling, is used to form one or more rows of such stiffeners. The cavity of each stiffener can be formed by either etching or stamping.

Because a printed circuit board is not included to serve as a stiffener, solder balls with a high reflow temperature can be used in the TGA package of the present invention. Further, in one embodiment, the TGA package of the present invention includes an elastomeric layer provided between the tape frame and the stiffener to absorb the shear stresses arising from a differential expansion between the TGA package and the motherboard on which the TGA package is installed.

Thus, the TGA package of the present invention is designed to allow many units of such TGA packages to be manufactured simultaneously. Each TGA package is supported by a carrier metal strip which, after singulation, serves as both a stiffener and a heatspreader in the TGA package. The metal strip is designed to be used with conventional equipment, tools and assembly processes used in the established PBGA package industry. In particular, such metal strip allows automated, magazine-to-magazine handling of the TGA packages through-out the assembly process, without requiring any modification to conventional BPGA equipment and processes.

In one embodiment, the metal strip is formed out of a low cost material, such as aluminum, copper, laminate metals, ceramic, molded or extruded plastics that are light and strong and can be mass manufactured at a low cost.

In one embodiment, the polyimide tape of the present invention can be manufactured in the reel to-reel format with or without sprocket holes or in the panel form. In this polyimide tape, tape frames are tiled to occupy the maximum possible usable area, and the tape frames are singulated prior to attachment to the stiffener. Consequently, the tape areas between frames, which are traditionally discarded, are eliminated. Since the tape cost constitutes a very high percentage of the materials cost of a TGA package, the cost of a TGA package of the present invention is minimized. At the end of the assembly process, when the TGA packages are singulated from the metal strip, only a small portion of the stiffener is discarded by the singulation process, the polyimide tape is preserved in the TGA package substantially in its totality.

The materials and package structure provide for a complete package assembly, including attachment of the solder balls, before the semiconductor die is attached. Subsequently, the semiconductor die is attached onto the stiffener, wire bonded, encapsulated and the package is singulated. This procedure results in a higher final assembly yield because the process allows for the package to be built and yielded first and then the semiconductor die is attached. Furthermore this process allows the package to be used for a semiconductor die where access to the die is required after the die is wire bonded into the package but before it is encapsulated.

The present invention can be used with two types of solder balls: the eutectic solder balls (a tin/lead alloy 63/37%), with a melting point at about 183° C. and a reflow temperature at about 220° C.; and the high temperature solder balls (a tin/lead alloy 10/90%), with a melting point at 300° C. and a higher reflow temperature. The present invention allows solder balls of either type to be reflowed on the package.

In one embodiment, a metalized polyimide tape which can withstand temperatures up to 400° C. is used.

In one embodiment, the reliability of the TGA package is enhanced by the increased elastic modulus of the high temperature solder balls, which are capable of withstanding the higher shear stresses resulting from a differential expansions between the package and the motherboard. In another embodiment, the reliability of the TGA package is enhanced by including an elastomeric layer under the tape to allow the solder balls to "rock" at an angle from their normal position, when subject to shear stresses resulting from the differential thermal expansions between the package and the motherboard. The "rocking" relieves some of the shear stresses, thereby reducing the frequency of fatigue cracking and delamination from the solder ball ads.

In one embodiment, a two-metal layer tape or a multiple-metal layer tape is used to enhance electrical performance. When a two-metal tape is used, one layer is provided for signal routing and the second layer is provided for power/ ground connections. In addition, the stiffener can be used as the ground plane, so that separate power and ground planes can be achieved for higher electrical performance, e.g. up to 500 Mhz.

The thermally conductive stiffener of the present invention provides a low thermal resistance path for heat dissipation from the encapsulated die to the ambient. Furthermore, significant heat is conducted through the thin tape to the solder balls and eventually to the motherboard. This thermal path in the TGA package of the present invention is more effective than a similar path in a PBGA or a CBGA package because the TGA package can be made thinner (4 mils vs. greater than 20 mils).

An appreciation of the claims and the different embodiments of this invention may be achieved by studying the following detailed description of the preferred embodiments and referring to the accompanying drawings.

BRIEF DESCRIPTION OF THE DRAWINGS

FIG. 1a shows the front view of a strip 100 of the prior art, which is designed to form a 27×27 mm PBGA package.

FIG. 1b shows the back view of strip 100 of FIG. 1a.

FIG. 2b shows the bottom view of strip 200 of FIG. 2a.

FIG. 2c shows a side view of strip 200 of FIG. 2a.

FIG. 7a shows a package 700 using a two-metal polyimide tape, in accordance with the present invention.

FIG. 8a shown another TGA package 800 of the present invention, which includes an elastomeric layer 802.

DETAILED DESCRIPTION OF THE PREFERRED EMBODIMENTS

Figure 1C:
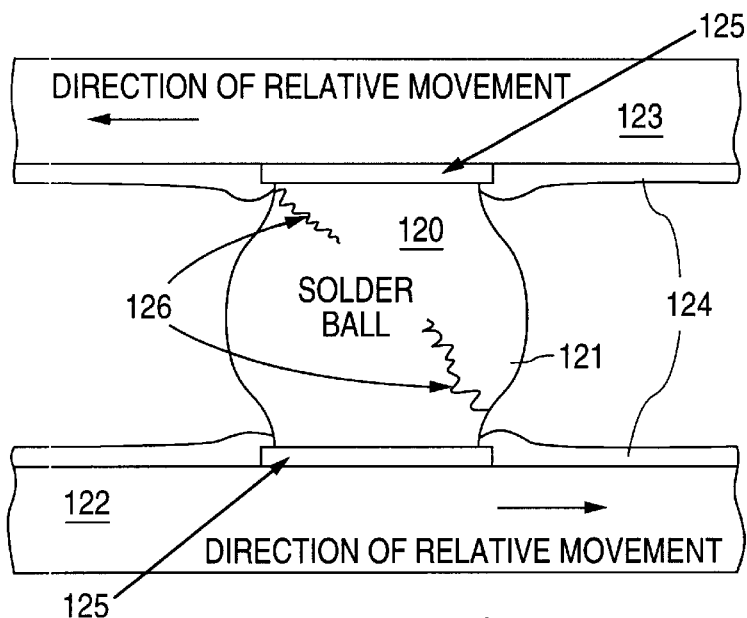
FIG. 1c shows a solder ball 120 cracking under shear stresses on both ends of the solder ball.

The present invention provides a novel TGA package using equipment, tools and established processes similar to those used in the BPGA packaging industry. To simplify this discussion, like elements in the accompanying figures are provided like reference numerals.

FIGS. 1a and 1b shows respectively the front and back views of a multilayer printed circuit board (PCB) strip 100 of the prior art, which is designed for forming six 27×27 mm stiffeners for six PBGA packages. PCB strip 100 is provided tooling holes 101-1 to 101-14 to facilitate automated handling by machines. In addition to tooling holes 101-1 to 101-14, three fiduciary marks 102-1 to 102-3 are provided to assist alignment during the package assembly process. Tooling holes 101-1 to 101-14 and fiduciary marks 102-1 to 102-3 are positioned in the area 104, which is outside of areas 103-1 to 103-6 from which the six packages are to be formed. Area 104 is discarded at a subsequent step of singulation, during which areas 103-1 to 103-6 are severed for further processing into individual packages. Oval through holes 104-1 to 104-7 and 105-1 to 105-12 are provided to assist singulation. Of course, depending upon the size and pin-count of the PBGA package, the design and construction of PCB strip 100 vary.

Figure 2A:
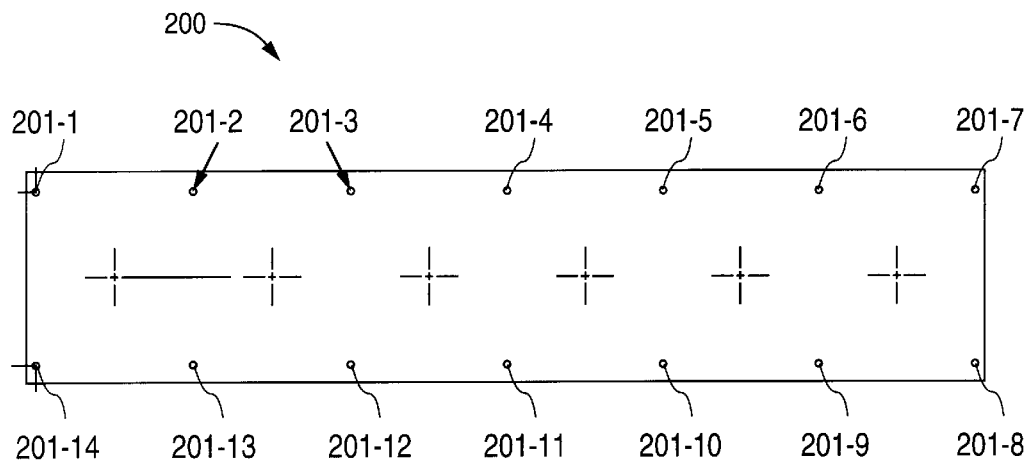
FIG. 2a shows the top view of strip 200, which is designed for a 27×27 mm TGA package.
Figure 2B:
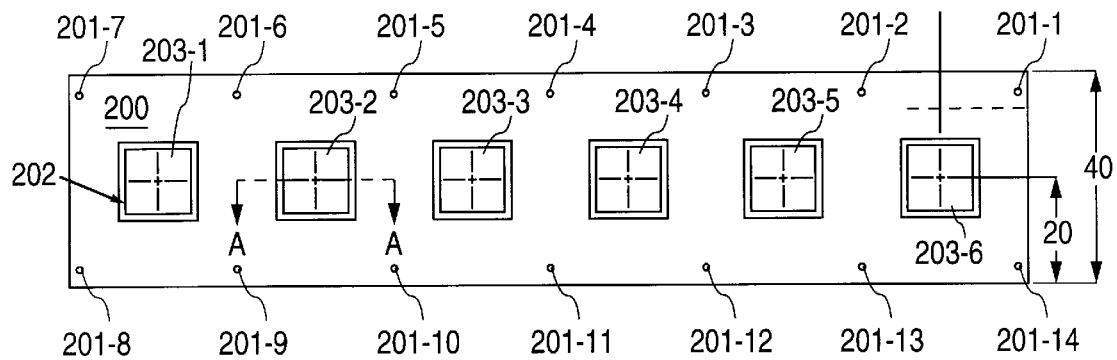
Figure 2C:
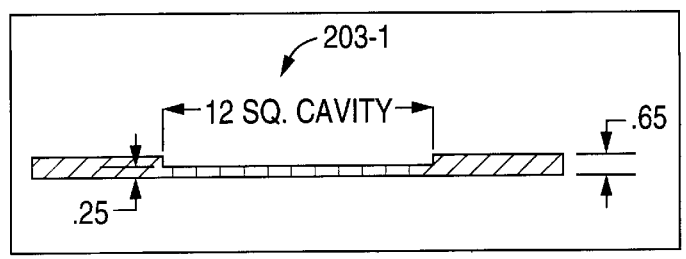

The present invention allows stiffeners of TGA type packages to be formed from a strip similar to PCB strip 100 of FIGS 1a and 1b discussed above. Such a strip is illustrated by strip 200 shown in FIGS. 2a, 2b and 2c. FIGS. 2a, 2b and 2c show, respectively, the top, bottom and side views of strip 200, which is designed for six 27 mm×27 mm TGA packages. In the present embodiment, strip 200 is a 0.65 mm thick 400 mm×40 mm metallic strip. Strip 200 can be formed from a thermally conductive material, such as copper or aluminum. Thus, a stiffener formed out of strip 200 serves also as a heat spreader. Materials like copper/molybdenum/copper, copper/tungsten/copper, copper/invar/copper or aluminum nitride are also suitable. Aluminum nitride, for example, has a thermal expansion coefficient similar to that of the semiconductor die. Therefore, the use of aluminum nitride as a stiffener can minimize shear stresses on the semiconductor die, thereby enhancing package reliability. Strip 200 can also be formed out of plastic using an injection molding technique. The advantage of a plastic strip is the significant cost reduction that can be realized. However, the thermal and electrical performances of a package using a stiffener singulated from a plastic strip are poor relative to those packages singulated from a metal strip. Of course, strip 200 can also be made out of ceramic.

Tooling holes 201-1 to 201-14 are provided in substantially the same manner as tooling holes 101-1 to 101-14, as discussed above with respect to strip 100. As shown in FIG. 2a, the top surface of strip 200 is substantially flat. This top surface can be plated with a metal, such as nickel, chromium or solder to provide a clean surface for attaching an external heatsink. Alternatively, this surface can be left bare, i.e. without plating, or can be oxidized to form a black oxide, in the case of a copper or an aluminum strip. The bottom surface (FIG. 2b), on which the polyimide tape is to be attached, can be left exposed or plated with nickel, chromium, palladium, silver or gold. A black oxide formed on a copper or aluminum strip would also improve tape adhesion to a stiffener formed out of strip 200.

Figure 3A:
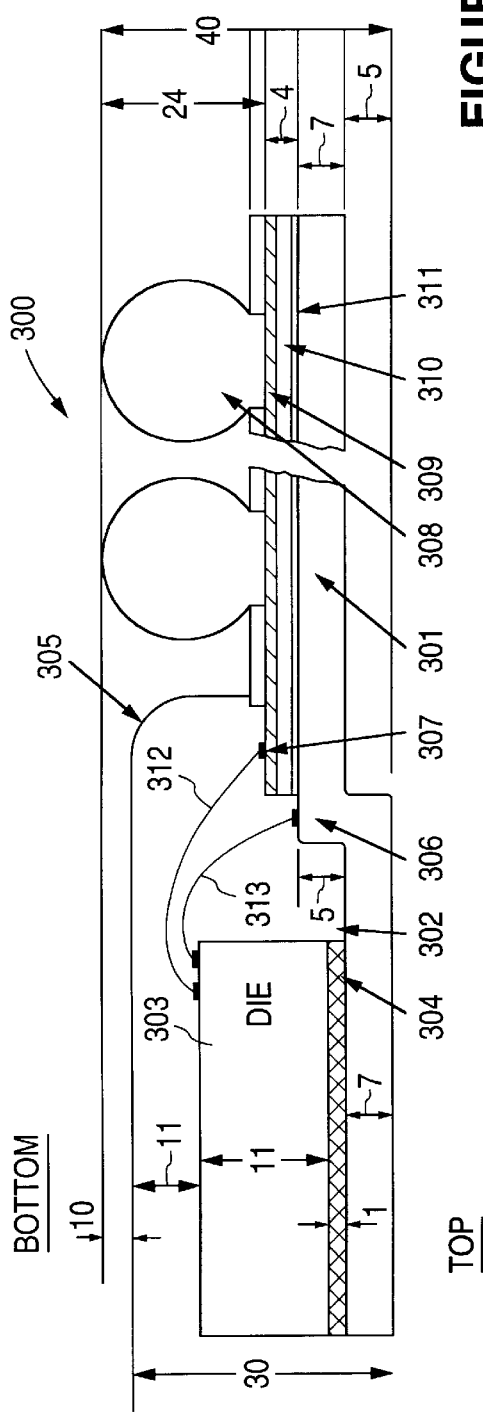
FIG. 3a shows a package 300 using a stamped stiffener singulated out of a strip similar to strip 200 shown in FIGS. 2a–2c above.

The bottom surface of strip 200 is shown in FIG. 2b. On the bottom side of strip 200 is formed, using either etching or stamping, six 12 mm×12 mm equally spaced cavities 203-1 to 203-6. In this embodiment, each cavity is 0.25 mm deep. Each of cavities 203-1 to 203-6 provides a recessed area in which the semiconductor die is subsequently attached. In the embodiment shown in FIGS. 2a, 2b and 2c, the bottom side of strip 200 is a flat surface. Alternately, however, the bottom side of strip 200 can also be stamped to form cavities 203-1 to 203-6, pushing out, 0.25 mm to 0.5 mm from the front surface, an area substantially corresponding in size to each cavity. FIG. 3a, discussed in further detail below, shows a TGA package 300 using this alternative embodiment. The depth of cavities 203-1 to 203-6 is primarily determined by the thickness of the semiconductor die each cavity is to hold. Of course, for a very thin semiconductor die, e.g. 0.25 mm, cavities 203-1 to 203-6 can be eliminated to reduce both the material and the processing costs of the stiffener.

On the bottom side (FIG. 2b) of strip 200, around the periphery of each of cavities 203-1 to 203-6, a ring 202 is plated. Plated ring 202 is used to allow ground bonds to be attached to the stiffener. Thus, ring 202 can be plated with a metal suitable for wire bonding, such as gold, silver, palladium, aluminum and other suitable metals. In applications where some solder balls must be reflowed directly onto the package, as described in U.S. Pat. No. 5,397,921 mentioned above, a solder wettable plating like gold, silver or palladium is desirable.

Of course, strip 200 can be also designed to include multiple rows of stiffeners. In processing, multiple rows of stiffeners allow a higher throughput and better material utilization. The choice between a single-row strip or a multiple-row strip to be used in a particular design is determined by the process capabilities of the automated assembly equipment.

A TGA package 300 formed using a stiffener discussed above is shown in FIG. 3a. FIG. 3a shows package 300 using a stiffener singulated out of a strip similar to strip 200 shown in FIGS. 2a–2c above. As shown in FIG. 3a, stiffener 301 is a stiffener formed out of a flat metal strip, or metal laminate, of substantially uniform thickness (approximately 0.007 inches). A cavity 302 is formed by a stamping process, which is less costly than forming such a cavity using an etching process. The stamping process is also more appropriate for the thinner TGA packages. As a result of the stamping process, the top surface of stiffener 301 has a raised surface (approximately, 0.005 inches high) corresponding in position to cavity 302 formed on the bottom side of the carrier strip. In TGA package 300, semiconductor die 303 (approximately 0.011 inches thick) is attached to the bottom of cavity 302 by epoxy film 304. As shown in FIG. 3a, epoxy film 304 is approximately 0.001 inches thick. At the peripheral area surrounding cavity 302, a thin epoxy layer 311 attaches a polyimide tape 310 to stiffener 301. In between the electrically insulated surfaces of polyimide tape 310 is developed a pattern of metallic traces 309 for interconnecting solder balls to bonding pads, such as bonding pad 307. Bonding pad 307 is connected to corresponding bonding pads on semiconductor die 303 by bond wires, such as bond wire 312. Ground bonds can be made between semiconductor die 303 and stiffener 301 at the plated ring (discussed above) around the periphery of cavity 302 using bond wires, such as bond wire 313. Through openings on the bottom surface of polyimide film 310, solder balls 308 contact metal traces 309 electrically. Cavity 302 and semiconductor die 303 are encapsulated in a thin encapsulation 305. As shown in FIG. 3a, the bottom surface of encapsulation 305 recessed at approximately 0.01 inches from the contact surface of the solder balls. In this embodiment, the thickness of encapsulation 305, as measured from the top surface of stiffener 301 to the bottom surface of encapsulation 305 is approximately 0.03 inches.

Figure 3B:
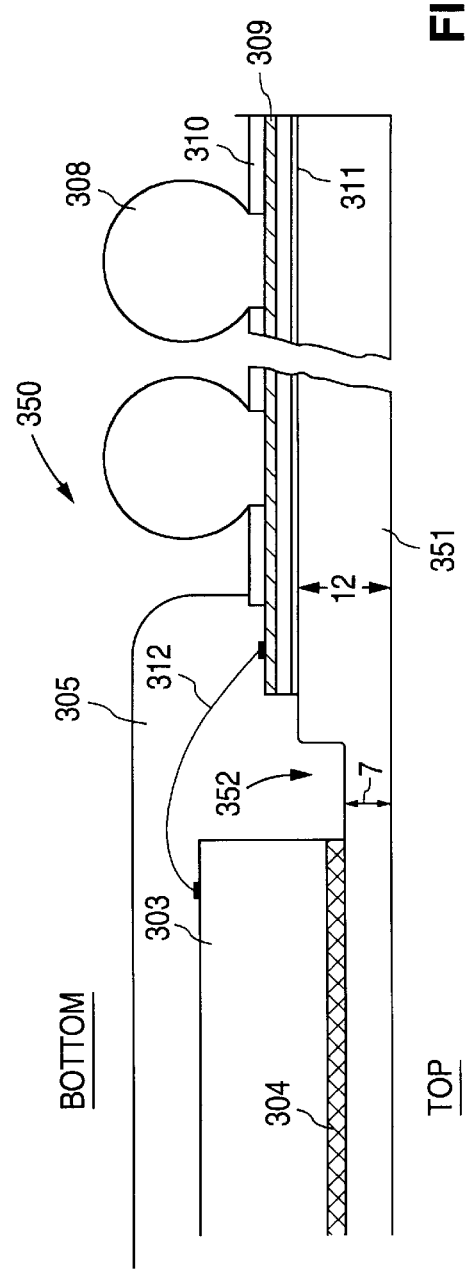
FIG. 3b shows a TGA package 350 using a stiffener having a cavity formed by an etching process.

FIG. 3b shows a TGA package 350 of the present invention using a stiffener in which the cavity is formed by an etching process. As shown in FIG. 3b, cavity 352 is formed in stiffener 352 from etching a 0.012 inches thick metal strip. In this embodiment, cavity 352 is 0.005 inches deep. Unlike stiffener 301 of FIG. 3a, stiffener 351 has a substantially flat top surface and is thicker at the peripheral area. An etched stiffener allows a heat dissipation higher than that of a stamped stiffener.

Figure 4:
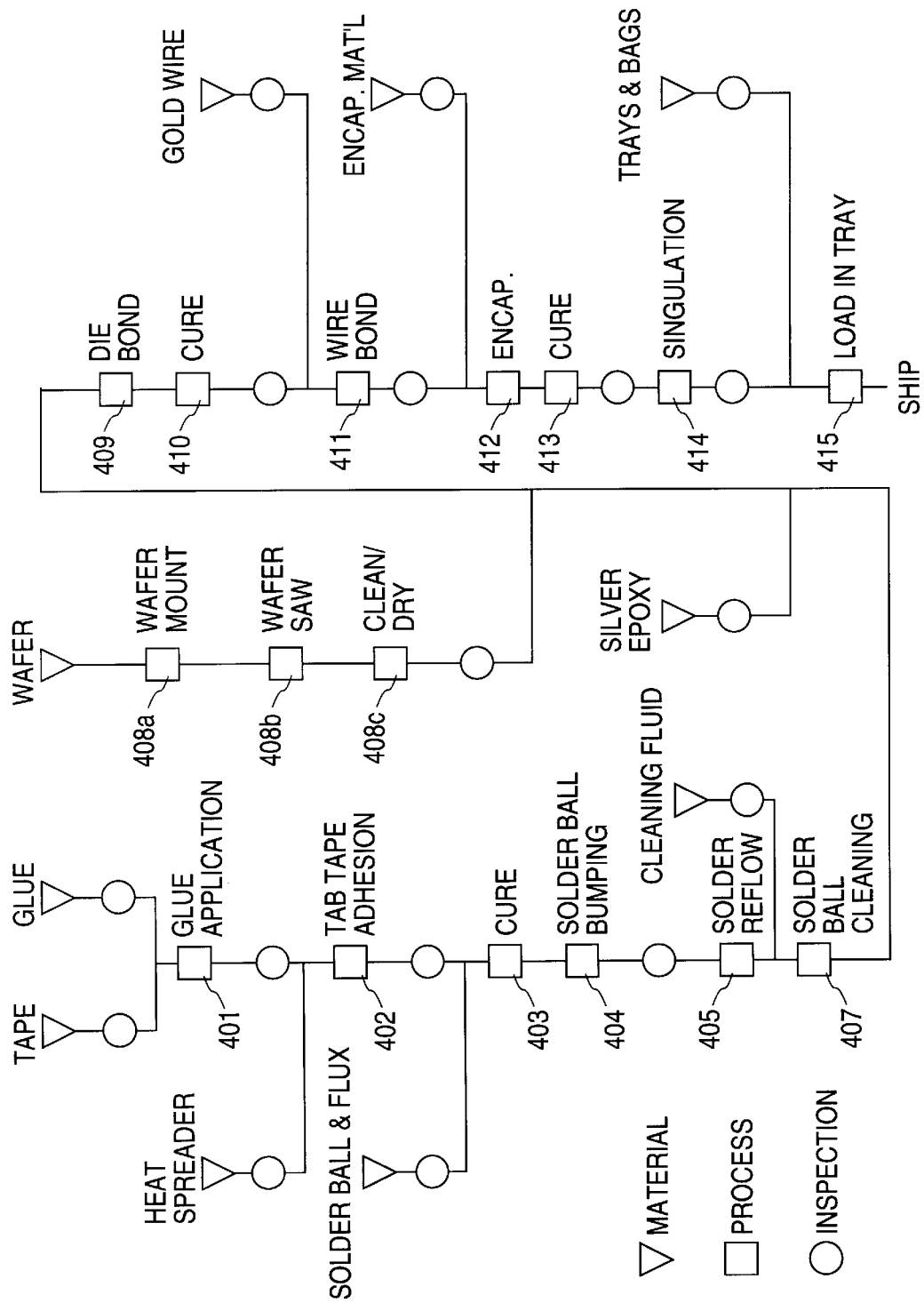
FIG. 4 shows an assembly process 400 for assembling a TGA package of the present invention.

The assembly process flow for assembling a TGA package of the present invention is illustrated by the process flow of FIG. 4. As shown in FIG. 4, at step 401, a thermoset or thermoplastic epoxy glue, approximately 1 mil thick, is applied to a tape. A suitable thermoset adhesive is the 3 Pm adhesive manufactured by Sheldahl Co. A suitable thermoplastic adhesive is the acrylic tape F-9460PC, manufactured by 3M Co. Even though these thermoset or thermoplastic adhesives may soften during a solder ball reflow step, such as solder ball reflow step 405 described below, these adhesives can withstand, without damage, the short duration of higher temperature in step 405, which lasts less than a minute. In this embodiment, the curing temperature of the thermoset epoxy glue is approximately 215° C.

After the thermoset or thermoplastic adhesive is applied, the tape frames on the tape are then singulated. At step 402, the singulated tape frames are attached to the carrier strip of the type described above (i.e. metal strips 300 and 305). During step 402, each tape frame is vacuum-held by a cylindrical fixture which aligns the tape frame to the tooling holes of the metal strip. The cylindrical fixture has a curved surface which is rocked against the metal strip to prevent any air bubbles to be trapped between the strip and the tape frame, as the tape frame is released onto the metal strip. The glue is then set on the metal strip under high heat (170° C.) and pressure. In this embodiment, a metal polyimide tape having a melting point above 400° C. is used.

Figure 5:
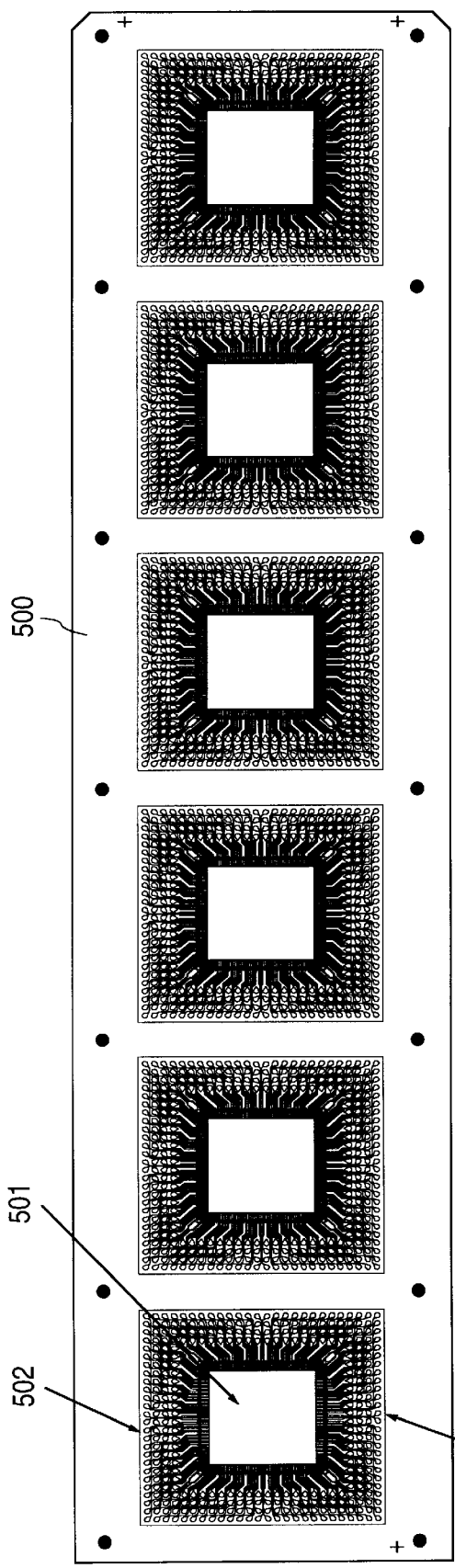
FIG. 5 shows the bottom side of a metal strip 500 after a TAB tape adhesion step.

FIG. 5 shows the bottom view of TGA strip 500 on which six singulated tape frames are attached. Each tape frame includes a cavity area 501 and a tape frame area 502. By singulating tape frames before attachment to the stiffener, tape frames can be tiled on the tape with minimal waste between frames. Thus, maximum tape utilization without waste can be achieved. In the prior art, tape cost in a TGA package can exceed 50% of the total package cost. Thus, by eliminating the wastage between frames, 38%–50% of the tape cost can be saved under the present invention. The tape shown in FIG. 5 will remain in the TGA package for the remainder of the assembly process.

Referring back to FIG. 4, at step 403, flux is applied to the bottom surface of the tape frame at the solder ball pads. Subsequently, at step 404, a robot places the solder balls on the fluxed solder ball pads of all six packages on the strip simultaneously, using a vacuum pickup stencil process. The type of solder balls to be used is selected based on the criterion that the solder balls should not melt under the die attach and wire bonding steps (i.e. steps 409–411 described below) of the process. Since the die attach epoxy is cured at 170° C. and wire bonding is performed at 170° C. or lower temperature, as described below, both eutectic solder balls (e.g. 63/37 tin/lead solder balls, or 62/36/2 tin/lead/silver solder balls, having melting points around 183° C.) and high temperature tin/lead alloy solder balls (e.g. 10/90 tin lead solder balls, having a melting point at 300° C.).

After the solder balls are placed, a laser inspection step at this point is applied to confirm that all solder balls are properly placed. A solder ball reflow step, at step 406, fixes the solder balls onto the tape frame using a reflow procedure, which is performed at 220° C. for eutectic solder balls. Unlike a PBGA package, the solder balls of the present invention are attached to a tape frame adhered to a metal strip, rather than a PCB. Thus, high temperature solder balls can be used for a TGA package of the present invention. Consequently, unlike a PBGA package, a TGA package of the present invention using high temperature solder balls does not fail under solder ball fatigue. The use of high temperature solder balls is enabled by the fact that their solder reflow temperature of 300° C. in high temperature solder balls is lower than the polyimide critical temperature (over 400° C.) and that the reflow time is short enough not to cause any damage to the tape epoxy adhesive.

A cleaning step, step 407, uses a conventional cleaning fluid to remove any excess solder flux from the bottom surface of the metal strip.

Figure 6:
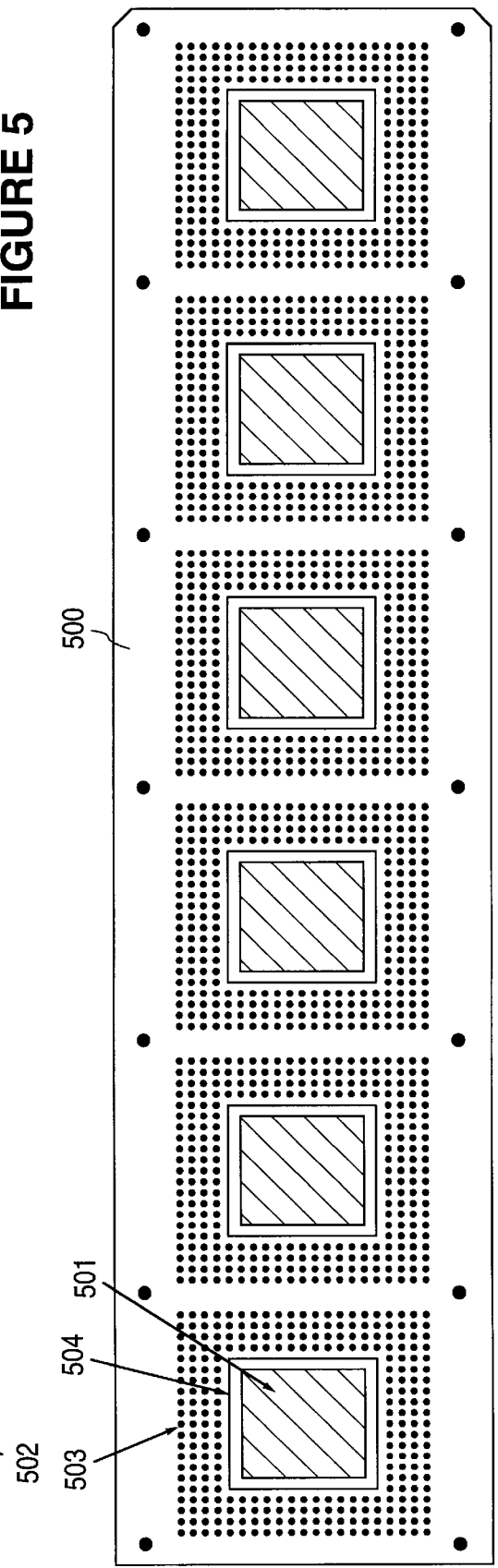
FIG. 6 shows the bottom side of metal strip 500 after a solder reflow step.

FIG. 6 shows strip 500 after step 407. As shown in FIG. 6, solder balls 502 are attached to a tape frame on strip 500. FIG. 6 shows ring 504 around the periphery of cavity 501 coated for ground bonding. The ability to assemble the package and to take yield loss prior to die assembly provide a higher die assembly yield and a lower assembly cost. In addition, the TGA package of the present invention can be used for applications where access, before encapsulation, to the die is desired for such purposes as device debugging or device programming.

At step 409, a semiconductor die is bonded by a uniform thin film (e.g. 1 mil) of silver epoxy to the bottom of each cavity on the carrier strip. The semiconductor die is obtained conventionally by dicing a wafer using a wafer saw. A curing period (i.e. step 410) after die-attach step 409 is provided, as appropriate, according to the requirements of the epoxy used. At step 411, gold bonding wires are then used to connect bond pads on the semiconductor die and either the bonding pads on the tape or, in the case of ground bonds, the ring at the periphery of each cavity. Because a low temperature PCB is not involved, wire-bonding temperature up to 170° C. can be tolerated. Wire bonding temperature 170 C. is lower than the solder ball melting temperature 183° C., for eutectic solder balls, or the material critical temperatures of the tape epoxy (215° C.) and the polyimide tape (over 400° C.).

At steps 412, the metal strip, including the semiconductor dies, the tape frames and the bond wires, are then encapsulated and cured, exposing only 0.01 inches of the solder balls. The six packages on the metal strip are then singulated and packed in containers for shipping, at steps 414 and 415 respectively.

Figure 7B:
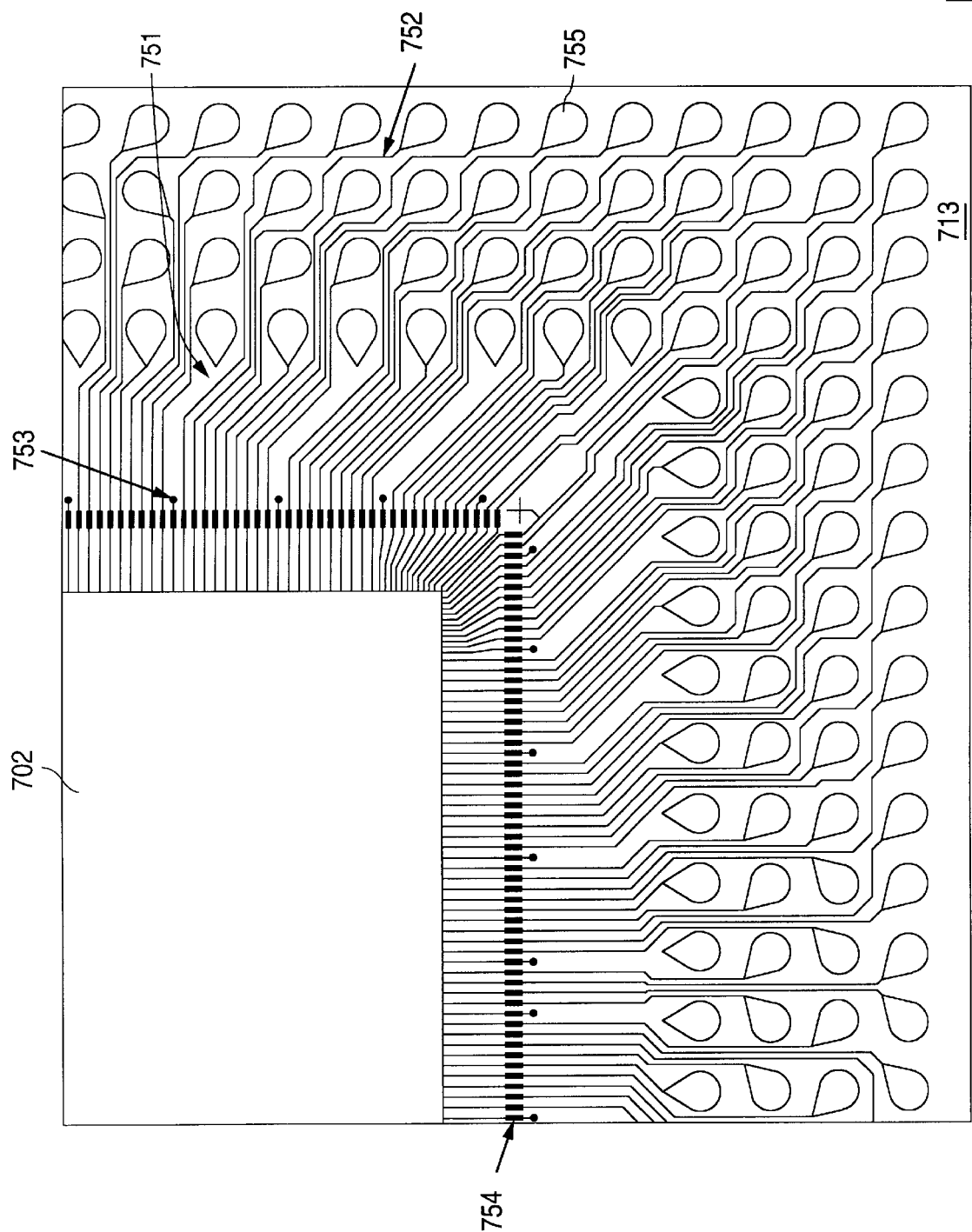
FIG. 7b shows signal layer 713 of polyimide tape 710, which is designed the for a 352 pin TGA. The tape has two metal layers.

To improve the electrical performance of a TGA package of the present invention, a TGA package using a two-metal tape (i.e. a polyimide tape including two insulated layers of metal traces) can be provided. Such a package can also be formed from the metal strip, such as strip 200 above. In fact, the strip design, construction and package assembly process are substantially the same as those described above. FIG. 7a shows a TGA package 700 using a two-metal polyimide tape, in accordance with the present invention. Unlike TGA package 300 of FIG. 3b, TGA package 700 uses a two-metal polyimide tape 710, which has a power/ground layer 712, in addition to a signal trace layer 713. As shown in FIG. 7a, tape 710 has a solder mask layer which allows selective connections of the power/ground layer 712 to be made to stiffener 701. Vias, such as via 714, are provided as through holes between metal traces in signal trace layer 713 and power/ground plane 712 to allow interconnection between these layers. Thus, TGA package 700 has three metal layers at its disposal: (i) signal trace layer 713 for signal routing; (ii) power/ground layer 712 for power connections; and (iii) stiffener 701, serving as a ground plane. Like elements in FIG. 3b and FIG. 7a are given like reference numerals. The connections to the semiconductor die are done via wire bonds. As shown in FIG. 7a also, in this embodiment, stiffener 701 is 0.025 inches thick, having a 0.015 inches etched cavity 702. TGA package 700 can provide high electrical performance up to 500 Mhz. This advantage is significant, since such performance is achieved in a cavity-down PBGA package or a ceramic BGA (CBGA) package only by using a multilayer substrate with three tiers, i.e. at significantly higher cost and larger electrical parasitic impedances. The superior electrical performance is achieved in the present invention through low-inductance power and ground connections and controlled impedance signal traces. FIG. 7b shows signal layer 713 of polyimide tape 710, which is designed for a 352 pin TGA. Solder ball pads, such as solder ball pad 755, are provided at the tape frame for connection to a mother board. Special solder ball pads, such as pad 751, are each connected through a via to the power/ground plane 712. Signal traces, such as trace 752 are coupled to wire bonding pads, such as wire bonding pad 752, close to cavity 702. Low inductance power and ground connections to signal trace layer 713 is achieved by having vias, such as via 753, located as closely as possible to the edge of cavity 702, hence as closely as possible to the semiconductor die.

FIG. 8a shows another TGA package 800 of the present invention, which includes an elastomeric layer 802. In this embodiment, stiffener 801 is similar to stiffener 701 of FIG. 7a, with an additional 0.005 inches recess 804 etched out of the stiffener. In recess 804 is provided a flexible elastomeric layer 802 between tape frame 710 and stiffener 801. As shown in FIG. 8a, elastomeric layer 802 is attached with adhesive layers 803, on one side, to the stiffener 801 and, on the other side, to polyimide tape 701. Both layers of adhesive layers 803 can be implemented by the same tape epoxy, such as tape epoxy 311 described above. Elastomeric layer 802 can be chosen from rather dense elastomers, such as silicone or viton type materials.

Figure 8B:
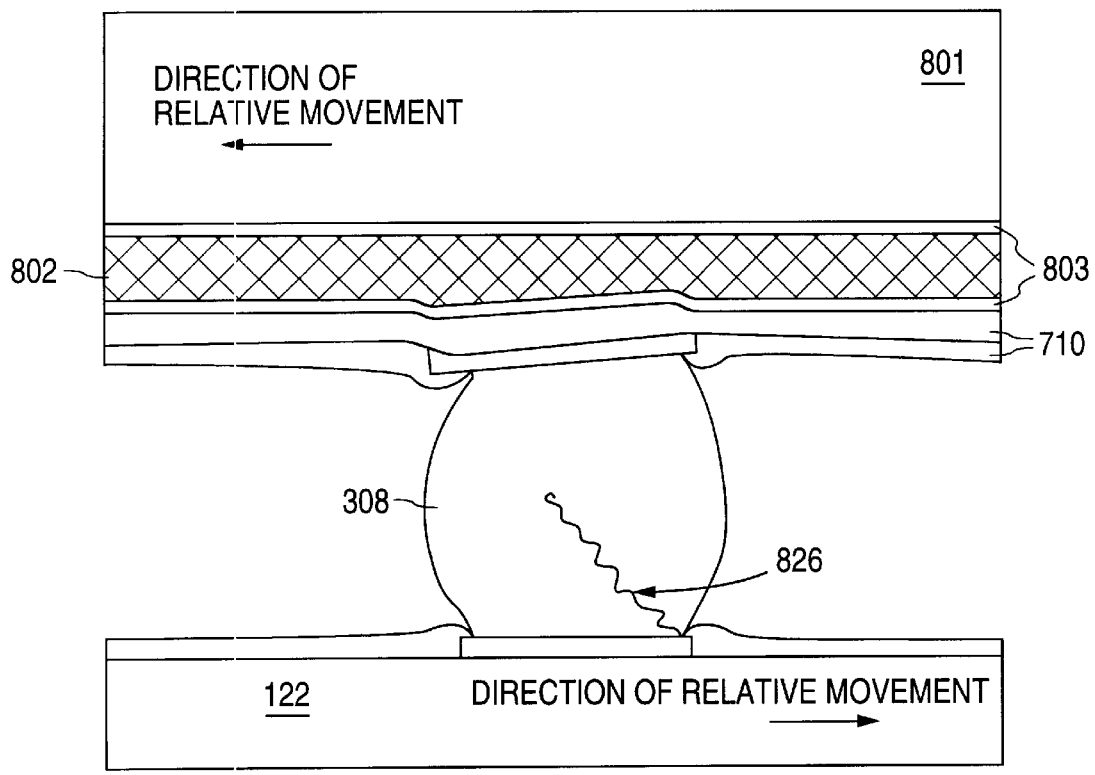
FIG. 8b shows how TGA package 800 allows the solder balls of TGA package 800 to withstand a larger shear stress before fatigue cracking can occur.

FIG. 8b shows how TGA package 800 allows the solder balls of TGA package 800 to withstand a larger shear stress before fatigue cracking can occur. As shown, in FIG. 8a, the deformation of elastomeric layer 802 under solder ball 308 due to "rocking" is reduced, since elastomeric layer 802 under polyimide tape 710 deforms, such that solder ball 308 can tilt in the direction of the relative movement of TGA package 800. Consequently, a fraction of the shear stress at TGA package 800 is relieved. Hence, fatigue cracking can then only occur at a greater level of shear stress at end 826 attached to motherboard 122.

The detailed description above is provided to illustrate the specific embodiments of the present invention and is not intended to be limiting to the present invention. Numerous modifications and variations within the scope of the present invention are possible. The present invention is defined by the following claims.

What is claimed is:

1. A method for forming a TGA package, comprising the steps of:

forming a plurality of stiffeners on a carrier strip, each stiffener having a cavity formed on one side of said strip;

singulating a plurality of tape frames from a tape, each tape frame including (i) a first plurality of conductive wire bonding pads, (ii) a plurality of solder ball bonding pads for attaching solder balls and (iii) a plurality of conductive traces each for routing a signal from one of said first plurality of wire bonding pads to a corresponding solder ball bonding pad;

attaching each of said tape frame to one of said plurality of stiffeners via a tape adhesive;

attaching a plurality of solder balls to said tape at said plurality of conductive bond pads using a reflow procedure;

attaching a semiconductor die to said cavity of said stiffener using a die attach epoxy, said semiconductor die having formed thereon a second plurality of wire bonding pads;

using a plurality of bond wires, coupling selected ones of said second plurality of wire bonding pads on said semiconductor die to corresponding ones of said first plurality of wire bonding pads;

encapsulating said semiconductor die and said bond wires with a resin encapsulation; and singulating each of said stiffeners from said carrier strip.

2. A method as in claim 1, wherein said step of singulated tape frames removes from a reel or panel that has these tape frames tiled.

3. A method as in claim 1, wherein said step of attaching said tape frames to said stiffeners applies a thermoset epoxy as a tape adhesive, said thermoset epoxy being capable of withstanding temperatures above 300 C.

4. A method as in claim 1, wherein said step of attaching said tape frames to said stiffeners applies a thermoplastic epoxy as a tape adhesive, said thermoset epoxy being capable of withstanding temperatures above 300 C.

5. A method as in claim 1, wherein said step of attaching said solder balls to said tape is performed with solder balls selected from a group of solder balls selected from a selected from tin/lead alloy (63/37%) or tin/lead/silver alloy (62/36/2%).

6. A method as in claim 1, wherein said step of attaching said solder balls to said tape is performed with solder balls comprising a tin/lead alloy (10/90%).

7. A method as in claim 1, wherein said step of attaching solder balls to said tape precede said step of attaching said semiconductor die.

8. A method as in claim 1, further comprising the step of providing an elastomeric layer, said elastomeric layer attached between said tape and said stiffener using adhesive.

9. A method as in claim 8, wherein said elastomeric layer is selected from a group including a silicone type elastomer, a viton type elastomer or a silicone type thick adhesive.

* * * * *